United States Patent
Patapoutian et al.

(10) Patent No.: US 9,312,886 B2
(45) Date of Patent: Apr. 12, 2016

(54) STORAGE DEVICE WITH MULTIPLE CODING REDUNDANCIES

(71) Applicant: Seagate Technology LLC, Cupertino, CO (US)

(72) Inventors: Ara Patapoutian, Hopkinton, MA (US); Deepak Sridhara, Longmont, CO (US); Zheng Wang, Longmont, CO (US); Jason Charles Jury, Minneapolis, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/032,677

(22) Filed: Sep. 20, 2013

(65) Prior Publication Data
US 2015/0089317 A1 Mar. 26, 2015

(51) Int. Cl.
G11C 29/00 (2006.01)
H03M 13/35 (2006.01)
G11B 20/12 (2006.01)
G11B 20/18 (2006.01)
H03M 13/11 (2006.01)
H03M 13/15 (2006.01)

(52) U.S. Cl.
CPC ......... *H03M 13/353* (2013.01); *G11B 20/1217* (2013.01); *G11B 20/1833* (2013.01); *H03M 13/1102* (2013.01); *H03M 13/152* (2013.01); *H03M 13/1515* (2013.01)

(58) Field of Classification Search
None
See application file for complete search history.

(56) References Cited

U.S. PATENT DOCUMENTS

| 5,392,290 | A | * | 2/1995 | Brown et al. ............... 714/6.12 |
| 5,450,421 | A | * | 9/1995 | Joo et al. ..................... 714/756 |
| 6,081,210 | A | | 6/2000 | Nikolic et al. |
| 6,127,954 | A | | 10/2000 | Kim |
| 6,275,176 | B1 | | 8/2001 | Bruekers et al. |
| 6,345,021 | B1 | * | 2/2002 | Belser et al. ................ 369/47.1 |
| 6,504,493 | B1 | * | 1/2003 | Burd ............................. 341/50 |
| 6,747,827 | B1 | * | 6/2004 | Bassett et al. .................. 360/53 |
| 7,164,371 | B2 | * | 1/2007 | Lee et al. ....................... 341/58 |
| 8,296,625 | B2 | | 10/2012 | Diggs et al. |
| 8,375,274 | B1 | * | 2/2013 | Bonke .......................... 714/770 |
| 8,683,295 | B1 | * | 3/2014 | Syu et al. ..................... 714/763 |
| 8,806,302 | B2 | * | 8/2014 | Kim et al. .................... 714/773 |
| 8,854,755 | B2 | * | 10/2014 | Chang et al. ................... 360/39 |
| 2001/0050890 | A1 | * | 12/2001 | Okamoto ............... G11B 7/005 369/59.24 |
| 2002/0150179 | A1 | * | 10/2002 | Leis et al. .................... 375/340 |
| 2003/0037299 | A1 | | 2/2003 | Smith |
| 2004/0151091 | A1 | * | 8/2004 | Ma et al. ................... 369/47.22 |
| 2006/0174185 | A1 | * | 8/2006 | Krachkovsky et al. ....... 714/801 |
| 2006/0277434 | A1 | * | 12/2006 | Tsern et al. ..................... 714/17 |
| 2007/0011563 | A1 | * | 1/2007 | Tsang .......................... 714/758 |
| 2012/0185747 | A1 | * | 7/2012 | Kim et al. .................... 714/755 |
| 2012/0304037 | A1 | * | 11/2012 | Reddy et al. ................. 714/763 |
| 2014/0101515 | A1 | * | 4/2014 | Akiyama et al. ............. 714/763 |
| 2014/0229801 | A1 | * | 8/2014 | Eroz et al. ................... 714/776 |

FOREIGN PATENT DOCUMENTS

EP 2246854 A1 11/2010

* cited by examiner

*Primary Examiner* — Daniel McMahon
(74) *Attorney, Agent, or Firm* — HolzerIPLaw, PC

(57) ABSTRACT

A storage device is configured to utilize different encoding and decoding schemes in reading and writing data to different regions of a storage device based on the position of the storage regions and/or component-specific physical characteristics of the regions. Each encoding scheme may include multiple different types of encoders selected based an optimization process for each region.

15 Claims, 4 Drawing Sheets

US 9,312,886 B2

STORAGE DEVICE WITH MULTIPLE CODING REDUNDANCIES

SUMMARY

Implementations described and claimed herein provide for selection of different encoding schemes for use in association with different regions of a storage medium based on component-specific physical characteristics.

Other implementations described and claimed herein provide for a microcontroller that selects an encoding scheme for writing data in response to a write request. The encoding scheme includes a first encoder selected from a plurality of encoders of a first encoder type and a second encoder selected from a plurality of encoders of a second encoder type, wherein the second type is different from the first type.

Still other implementations described and claimed herein provide for a storage device including different first and second encoders of the same encoder type. The first encoder encodes data associated with a physical block address (PBA) region of a first storage medium and the second encoder encodes data associated with the same PBA region of a second storage medium.

Other implementations are also described and recited herein.

DETAILED DESCRIPTION

Figure 1:
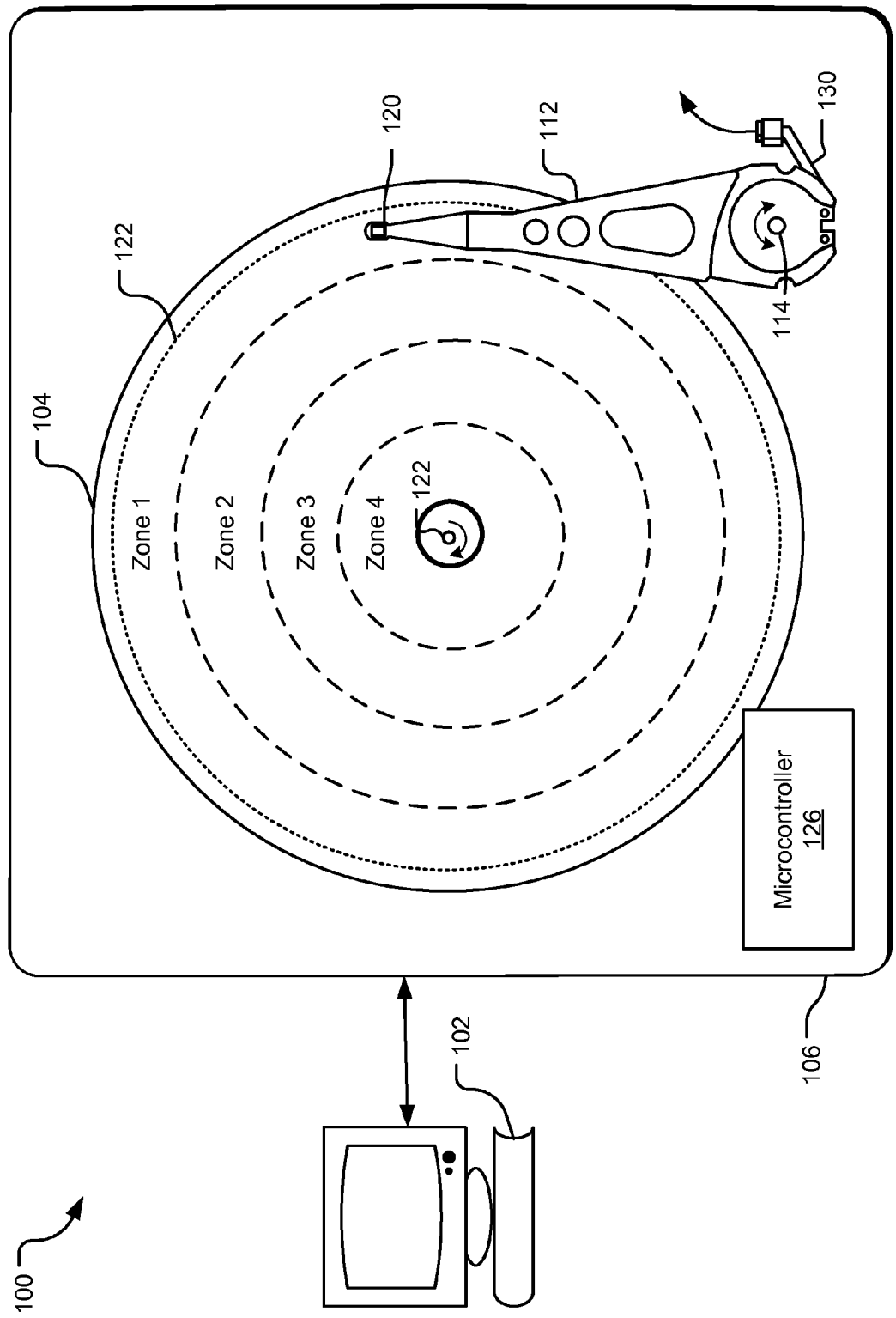
FIG. 1 illustrates a data storage system for storing data with a plurality of coding redundancies.

FIG. 1 illustrates a data storage system 100 for storing data with a plurality of coding redundancies. The data storage system 100 includes a host computer 102 that sends one or more access commands (e.g., read or write commands) to a storage device 106. The storage device 106 is a disk drive assembly; however, in other implementations, the storage device 106 may be any device having any tangible computer-readable storage media. Such tangible computer-readable media may include without limitation magnetic storage disks, solid state drives, flash memory, optical storage disks, random access memories (RAMs), read only memories (ROMs) and the like. The storage device 106 includes a disk 104 that may store data on one or both of its planar surfaces (only one planar surface is shown). Further, each planar surface capable of storing data includes a series of thin concentric circular strips known as tracks (e.g., a data track 122).

A head assembly (e.g., a head 120) is positioned adjacent to each planar surface capable of storing data. Each head assembly reads and writes data to and from the corresponding planar surface. The head 120 is attached to a distal end of an actuator arm 112 positioned over the disk 104. A rotary voice coil motor that rotates about an actuator axis of rotation 114 is used to position the head 120 on a data track (e.g., the data track 122) and a spindle motor that rotates about disk axis of rotation 122 is used to rotate the disk 104. A flex cable 130 provides the requisite electrical connection paths for the slider 120 while allowing pivotal movement of the actuator arm 112 during operation. Servo signals are detected and demodulated by one or more demodulator circuits (not shown) and processed by a digital signal processor (DSP) (not shown) to control the position of the head.

It should be understood that the described technology may be used with a variety of storage formats, including continuous magnetic media, discrete track (DT) media, shingled media, etc.

The storage device 106 includes a microcontroller 126 that includes a plurality of encoders configured to encode data from the host computer 102 before the data is written to the disk 104. The encoders may be hardware, software, and/or firmware executable by an integrated processor of the storage device 106 or a processor of a host computer 102.

To write data to the disk 104, the host computer 102 sends data in a form of a binary data stream (i.e., a series of 1s and 0s) to the storage device 106. The microcontroller 126 receives the binary data stream and selects one or more encoders to encode the data before writing it to the disk 104. The encoders add additional bits (e.g., error-correcting bits) and/or convert the data stream into a form suitable for recording. When data is read back from the disk 104, the additional bits may allow the storage device 106 to detect a limited number of errors that occur in the read data.

Encoders can be classified as block codes (i.e., "block encoders") and convolutional codes (i.e., "convolutional encoders"). Block codes work on fixed-size blocks or symbols of predetermined size. Convolutional codes work on bit or symbol streams of arbitrary length. As used herein, the term "encoder type" refers to subclasses of block encoders and convolutional encoders. One subclass includes modulation codes. Another subclass includes sector-based error correction (ECC) codes. Yet another subclass includes track-based ECC codes, and more generally, zone-based ECC codes (e.g., where a zone includes multiple data tracks). Each of these encoder types is discussed in further detail below.

A sector-based ECC encoder adds coding redundancies to a data stream to enable error correction within an area of a storage medium. When two different ECC encoders work on different regions of the disk 104, the two ECC encoders are different "encoder types." An area on the disk 104 that a sector-based ECC code works on may be an individual sector, a data track, or some other predefined region.

When data is read back from the predefined region, ECC coding redundancies stored in the data are used to help ensure that the data is read back correctly. For example, a sector-based ECC code may be used to correct data of an individual data sector by analyzing data read from the sector. Likewise, a track-based ECC code may be used to correct data of a sector within a data track by analyzing data read from the entire data track. Similarly, a shingled magnetic recording device that reads and writes data in bands (e.g., groupings of multiple data tracks) may utilize a band-based ECC code to correct data within a band by analyzing data of the band.

A modulation encoder is another encoder type that analyzes the pattern of 1s and 0s within a binary data stream and alters the pattern to reduce the number of write errors that may occur as a result of too many consecutive transitions (e.g., from 0 to 1 or vice versa). Modulation codes add constraints to a binary data stream to suppress or eliminate certain patterns that are more error prone than others. For example, the pattern 1010101 may be more prone to error than 1111000. If the modulation encoder eliminates or suppresses high frequency patterns such as 1010101 or 0101010, fewer errors are included when the stored data is decoded. To impose constraints, the modulation encoder adds one or more redundant bits to the end of the data stream. A modulation decoder converts the altered binary data stream back to the original binary data stream when the data is read back from the storage medium 104 during a read operation.

The error-correcting capability of an encoder or multiple encoders is, in some implementations, limited by the number of redundant bits that the encoders add to the data stream. In theory, the larger the number of redundant coding bits associated with a predetermined number of data bits, the larger the number of errors that can be corrected in the data when it is read back. However, as more redundant bits are added to the data stream, more space is delegated to these redundant bits at the expense of user data bits. Thus, tradeoffs between storage space and error correction power exist.

To maintain a target data storage capacity while allowing for increased numbers of redundant bits, some media are manufactured to include data bits stored closer together. When the data bits are already tightly-packed together on a storage medium, adding too many redundant bits can result in an increase of the number of read and write errors. Such errors are even more numerous when data is read at a fast rate.

On magnetic disks, data bits near the outer diameter (OD) are read at a faster rate than data bits near the inner diameter (ID). This is because the number of data bits per data track increases toward the OD of the storage medium. For example, data tracks near the OD of the disk 104 (e.g., in zone 1) may include about twice as many data bits as data tracks near the ID. Because the disk rotates at a constant rate, each data bit along the data track near the OD may be written to in less time (e.g., for example, in about half of the time) as a corresponding the data bit along the data track near the ID. Therefore, when an encoding scheme includes too many redundant bits, the corrective power of such redundancies can be effectively reduced by an increased number of write impairments that occur due to spatial and temporal limits of the write process of the head 120.

To allow for error correction and error prevention that is optimized in different areas of the disk 104, the microcontroller 126 includes multiple different encoder types (e.g., sector-based ECC encoders, modulation encoders, track-based ECC encoders, zone-based ECC encoders, etc.), and one or more encoders of each encoder type. The microcontroller 126 applies different encoding schemes to different regions of the disk 104. "Different regions" may refer to, for example, different surfaces of the disk 104, different areas on one side of the disk 104, or the same or different areas on two different disks in the storage device 106.

An example "encoding scheme" includes two or more different types of encoders used in combination in a data storage operation. For example, one encoding scheme may include a sector-based ECC encoder, a track-based ECC encoder, and a constraint-imposing modulation encoder.

Each recordable surface on the disk 104, and other disks within the storage device 106, is divided into multiple zones (e.g., Zone 1, Zone 2, Zone 3, and Zone 4) of recordable tracks corresponding to sequentially increasing physical block address (PBA) ranges. The term zone is used interchangeably herein with the term "regions." Greater or fewer zones and/or logical block addresses may exist in other implementations. Further, the sizes of each respective zone may vary from disk to disk, even within a single storage medium with multiple disks.

An encoding scheme utilized in associated with data stored in Zone 1 may include, for example, a first ECC, modulation code, and a track-based ECC code (e.g., a number of parity sectors associated with each data track of the zone). The encoding scheme for Zone 2 may include a different ECC code, a different modulation code, and/or a different track-based ECC code. Zones 3, 4, and 5 may also include the same or different encoding schemes. Two different encoding schemes may include one or more common encoders. Other implementations include encoding schemes with one or more additional encoder types.

When writing data to a zone on the disk 104, the microcontroller 126 selects an encoding scheme that is specifically optimized for the zone. For example, a first ECC encoder with a low code rate may be selected for a data write operation near the ID of the disk 104, such as in zone 4. Also, a sector-based ECC encoder with a high code rate (e.g., fewer redundant bits) may be selected for a data write operation near the OD of the disk 104, such as in zone 1. This allows for more time for each bit to be recorded near the OD, where bits are written to and read from with greater speed than bits near the inner diameter.

The various encoders associated with each zone may be selected based on physical characteristics that can vary from one storage medium to another or from one head to another. These characteristics are referred to herein as "component-specific physical characteristics." For example, one component-specific physical characteristic utilized in selecting modulation code is the channel bit density (CBD). Channel bit density refers to a ratio of the read-bit response width to the distance between data bits of an area or surface of the storage medium 104. For example, if each bit is one unit long (T=1), and if a pattern with an isolated transition (e.g., 0001000) is recorded and read back, the read back waveform may be a Gaussian pulse with a width at 50% amplitude (PW50) of 2 units. In such case, the CBD is PW50/T, or 2. The CDB can vary from one storage medium to another, and even vary between different surfaces of the same storage medium. In some implementations, the CBD varies as much as 25% between two surfaces of the same storage medium.

Higher CBD in a region implies a higher level of interference between adjacent bits in the region. This increased interference may make certain binary patterns more error prone when recorded in a higher CBD region than when recorded in lower CBD region. Therefore, applying more constraints in regions with higher CBDs may result in fewer overall read errors. Accordingly, in one implementation of the disclosed technology, a modulation code with a lower code rate (e.g., more coding redundancies) is selected to encode data associated with a zone on the disk with a higher CBD.

Another example component-specific physical characteristic is the fly height, or distance between the head 120 and the disk 104. The fly height may vary between different head/disk pairs in a hard drive assembly and between different storage devices. Different fly heights may make some encoders more effective than other encoders on a given disk and/or storage device. Still other example component-specific physical characteristics include variations between different reader heads, different writer heads, and different storage media due to manufacturing process variations. Each of these variations can affect performance of encoders in different ways.

Figure 2:
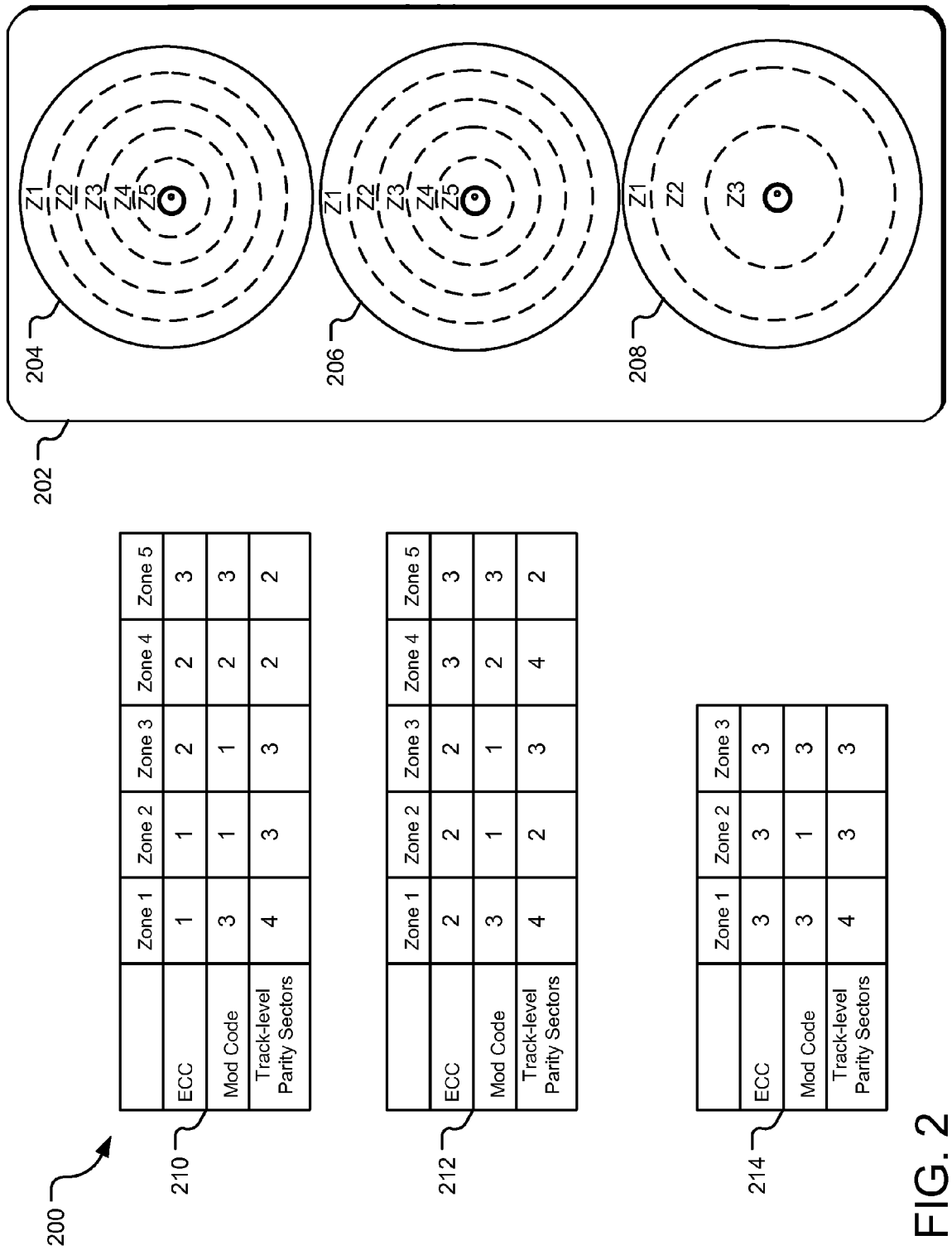
FIG. 2 illustrates an example system for implementing an encoding scheme with multiple coding redundancies.

FIG. 2 illustrates an example system 200 for implementing an encoding scheme with multiple coding redundancies. The system 200 includes a hard disk assembly 202 that includes three different example disks 204, 206, and 208. Each of the disks is divided into a number of Zones: Z1, Z2, Z3, etc. Fewer or additional zones are contemplated in other implementations.

In disks 204 and 206, the zone boundaries and sizes are identical. For example, on each of the disks 204 and 206, Z1 may correspond to LBAs 00000-09999, Z2 may correspond to LBA 10000-19999, Z3 may correspond to LBA 20000-29999, Z4 may correspond to LBAs 30000-39999; and Z5 may correspond to LBAs 40000-49999. However, the surface of disk 208 is divided into three zones instead of five. Therefore, one or more of boundaries of Zones 1, 2, and 3 of disk 208 do not correspond with the boundaries of Zones 1, 2, and 3 on disks 204 and 206. For example, Zone 1 on disk 208 may correspond to a different LBA range than Zone 1 on disk 206. In one implementation, the zones are surface-based. For example, a disk may have a first zone on a first surface and a second zone on a second surface.

Tables 210, 212, and 214 represent data files stored in memory of the hard drive assembly 202 or another memory apparatus communicatively coupled to the hard drive assembly 202. The tables 210, 212, and 214 are accessible by a microcontroller of the hard drive assembly 202 and used to determine which encoding or decoding scheme to implement in each read or write operation of the hard drive assembly 202. The table 210 includes code types for encoding schemes for each zone of the disk 204; the table 212 includes encoding schemes for each zone of the disk 206; and table 214 includes encoding schemes for each zone of the disk 208. An example encoding scheme includes a type of code applied by each of three encoder types: a sector-based ECC encoder, a modulation encoder, and a track-based ECC encoder. Other encoder types are contemplated for use in other implementations.

The first code type included in tables 210, 212, and 214 is a sector-based ECC code. Different sector-based ECC codes (e.g., sector-based ECC codes labeled as 1, 2, and 3) are selected for use in association with various zones on each of the three disks 206, 204, and 208. In one implementation, the different sector-based ECC codes selected for use in each different zone of the disk 204 are from same code family. For example, sector-based ECCs 1, 2, and 3 may all be different Low-Density Parity Check (LDPC) codes. In another implementation, the different ECC codes selected for use in various zones of a disk are codes that do not belong to the same code family. For example, ECC 1 may be an LPDC code; ECC 2 may be a Reed-Solomon (RS) error correction code; and ECC 3 may be a Bose Chaudhri and Hocquenghem (BCH) code. In another implementation, different sector-based ECC codes share the same endec hardware and may share the same circuitry.

The second code type included in tables 210, 212, and 214 is a track-based ECC code, which creates a number of parity code sectors in association with each data track on the disk. The number of parity sectors associated with the data tracks on each disk varies with the number. The number of parity sectors associated with each zone may be predetermined or adaptively determined.

The number of parity sectors associated with each zone on the disk 204 is a predetermined number based on the radial location of the zone. Fewer parity sectors are associated with zones encompassing data tracks that have fewer total sectors. For example, data tracks in zone 1 (near the OD) have more sectors than data tracks nearer to the ID. Accordingly, table 210 indicates that four parity sectors are associated with data tracks in zone 1. Data tracks in Zones 2 and 3 of disk 204 have fewer sectors than data tracks in Zone 1, but more sectors than data tracks in Zones 4 and 5. Accordingly, table 210 indicates that three parity sectors are associated with data tracks in Zones 2 and 3. In addition, table 210 indicates that two parity sectors are associated with data tracks in Zones 4 and 5 of disk 204. These zones have the fewest number of sectors per data track.

In one implementation, the sector-based ECC and/or modulation code associated with each zone is selected, via an optimization test process, from a preselected pool of possible codes. For example, the preselected pool may include three LPDC codes and three different modulation codes. Each pair combination (e.g., a pair including one LPDC code and one modulation code) is tested on each zone to determine an associated average bit error rate (BER), sector failure rate (SFR), or other performance metric. The pair that yields optimal performance for a given zone is selected for association with that zone and recorded in a table of the hard disk drive. In the same or another implementation, one or more encoders are selected based on a performance metric, and one or more other encoders are selected based on a radial location of each zone.

In the example of FIG. 2, the number of track-based ECC parity sectors associated with each zone on the disk 206 is determined differently than the number of track-based ECC parity sectors associated with each zone on the disk 204. On the disk 206, the number of track-based ECC parity sectors is adaptively determined (e.g., on a per-disk basis) for each zone based on sector failure rate statistics. In this case, a larger number of parity sectors are associated with zones that exhibit high read failure rates. For example, table 212 indicates that Zone 4 of disk 206 includes four parity sectors even though it is located toward the inner diameter of the disk 206. This may be the case if, for example, Zone 4 is associated with high read failure rate. In the same or another implementation, zones without high read failure rates have parity sectors assigned to them based on radial location.

The third code type included in tables 210, 212, and 214 is modulation code. Different modulation codes (e.g., Mod Code 1, Mod Code, 2, and Mod Code 3) may encode codes from the same family of modulation code or from different families of modulation code. For example, Mod Code 1 may be a Running Digital Sum (RDS) code; Mod Code 2 may be a Maximum Transition Run (MTR) code; and Mod Code 3 may be a universal modulation encoder. Alternatively, Mod Codes 1, 2, and 3 may all be from the same code family.

In one implementation, the modulation codes are each generated by a universal modulation encoder and Markov chains are used to encode the data. The transition probability (i.e., probability of transitioning from one state to another on the Markov diagram) is different for two or more of the modulation codes 1-3. In the same or another implementation, different modulation codes share the same endec hardware and may share the same circuitry.

The modulation code selected for use in association with each zone may be selected based on the channel bit density (CBD) of the zone. In one implementation, a high channel bit density (CBD) is associated with a lower code rate (e.g., more redundant bits). For example, zones 1 and 3 of disk 208 may have a higher CBD than zone 2 and may therefore be associated with a modulation code having a lower code rate (e.g., Mod Code 3, as shown in table 214).

Zone sizes and boundaries may be statically determined (e.g., such as based on an even division of LBA into a set number of zones). Additionally or alternatively, zone sizes and boundaries may be adaptively determined, such as during a factory testing and optimization process. Adaptive determination of zone sizes and/or boundaries may take into account physical parameters of the storage medium 104 such as CBD, fly height, bit intervals, etc. For example, the testing and optimization process may draw a zone boundary to intersect a point at a radial distance from the inner diameter where a sharp variation in CBD is observed.

In FIG. 2, one or more of the encoders associated with each zone on each of the three disks is selected on per-disk basis (e.g., based on performance statistics of each disk). Thus, Zone 1 on disk 204 is associated with the sector-based ECC labeled 1; Zone 1 on disk 206 is associated with the sector-based ECC labeled 2; and Zone 1 on disk 208 is associated with the sector-based ECC labeled 3.

In another implementation, the zone sizes, boundaries, and/or specific encoding scheme associated with each zone are determined on a per-product basis. For example, hard disk drives manufactured for implementation in laptop computers may have a different coding schemes than hard disk drives manufactured for implementation in desktop computers. This may be, for example, because performance is valued more highly in some types of products, such as enterprise products, than in other products, such as personal user products.

Figure 3:
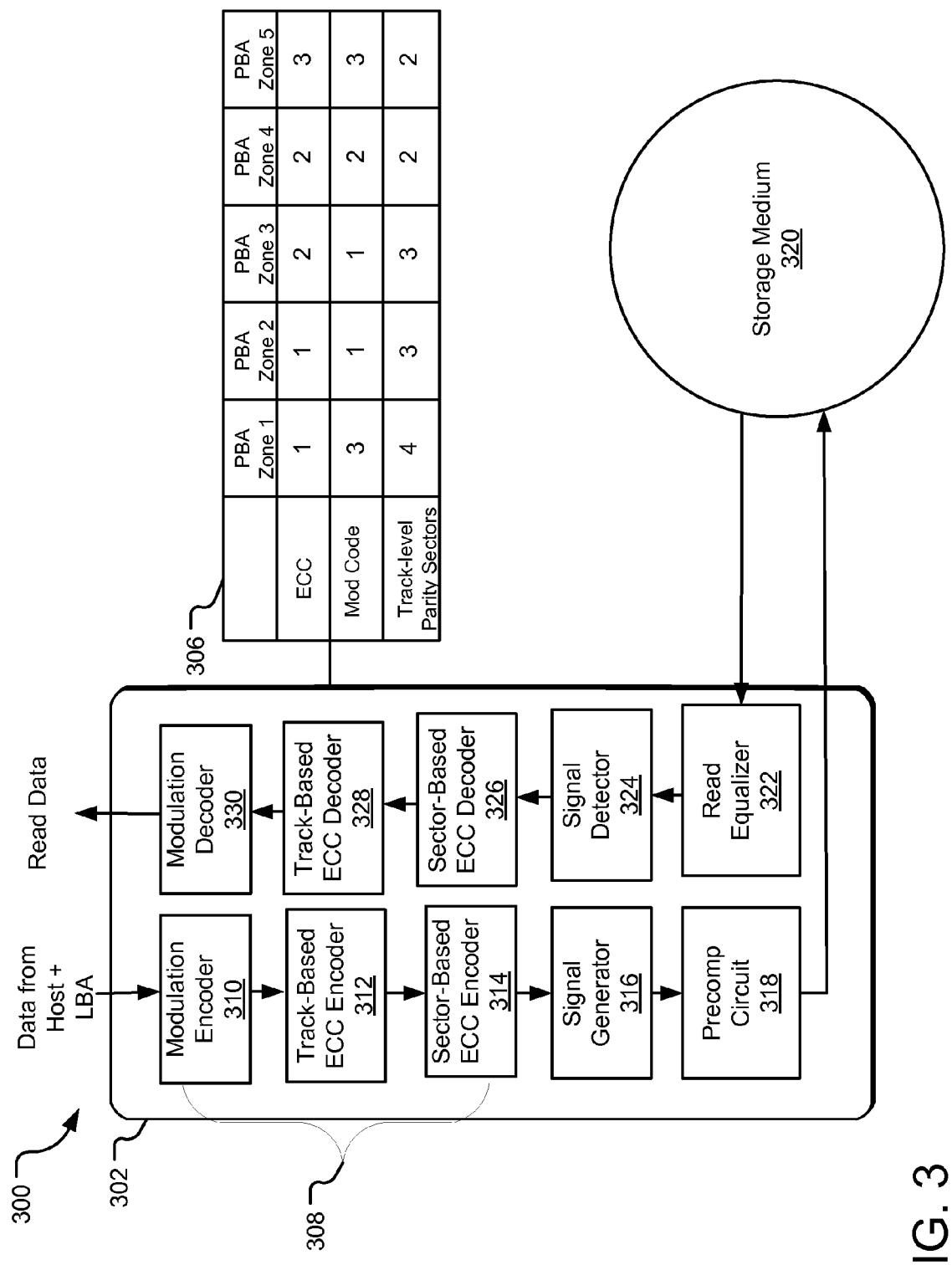
FIG. 3 illustrates an example digital recording channel for a hard drive disk for implementing an encoding scheme with multiple redundancies.

FIG. 3 illustrates an example digital recording channel 300 for a hard drive disk for implementing an encoding scheme with multiple coding redundancies. A signal from a host computer is received by a microcontroller 302 of a storage device.

A preprocessor (not shown) may compress the data and perform other data preprocessing before the data passes into a channel encoder 308, which includes a plurality of encoder types including a modulation encoder 310, a track-based ECC encoder 312, and a sector-based ECC encoder 314. Each of the modulation encoder 310, track-based ECC encoder 312, and sector-based ECC encoder 310, are hardware and/or firmware configured to apply multiple different encoders. For example, the ECC encoder 310 is configured to encode data using any of ECC 1, ECC 2, or ECC 3. Thus, the ECC encoder 310 effectively includes three separate encoders that share the same endec hardware.

The microcontroller 302 access a data record 306 to select encoders to be used in a data storage operation of the data. The data record 306 may be, for example, a table stored on the storage device or otherwise accessible by the microcontroller 302 of the storage device 306. The microcontroller 302 uses a physical block address (PBA) received from the host to identify encoders that are associated with the PBA in the data record 306. For example, the host may specify a PBA that the microcontroller 302 determines is associated with Zone 2. Using the data record 306, the microcontroller 302 selects an appropriate encoding scheme to be applied in Zone 2. The encoding scheme includes a modulation code (e.g., Mod Code 1) to be applied by the modulation encoder 310, a number of track-based parity sectors (e.g., 3 parity sectors) to be applied by the track-based ECC encoder 312, and a sector-based ECC code (e.g., ECC 1) to be applied by the sector-based ECC encoder 314. In other implementations, other encoder types are included in the microcontroller 302. For example, the track-based ECC encoder 312 may be a zone-based ECC encoder used to correct data of a zone (e.g., a zone including multiple data tracks) by analyzing data read from the zone.

The selected encoders of the channel encoder 308 encode the data, adding one or more constraints or error-correcting bits, and convert the data stream into a form suitable for recording. This signal is generated by a signal generator 316, passed through a precomp circuit 318, and generated as a write current for a recording head that records a pattern of magnetic flux reversals on a storage medium 320.

When the flux reversals between magnetic data bits are sensed by the read head, the pulses are equalized by a read equalizer 324 and detected by a signal detector 324. The microcontroller 302 selects appropriate decoders to be applied by a sector-based ECC decoder 326, a track-based ECC decoder 328, and a modulation decoder 330. Each of the sector-based ECC decoder 326, track-based ECC decoder 328, and modulation decoder 330 are hardware and/or firmware configured to apply multiple different decoders. The signal is decoded and demodulated by the decoders in the channel encoder 308 before being presented at the output as read data.

Figure 4:
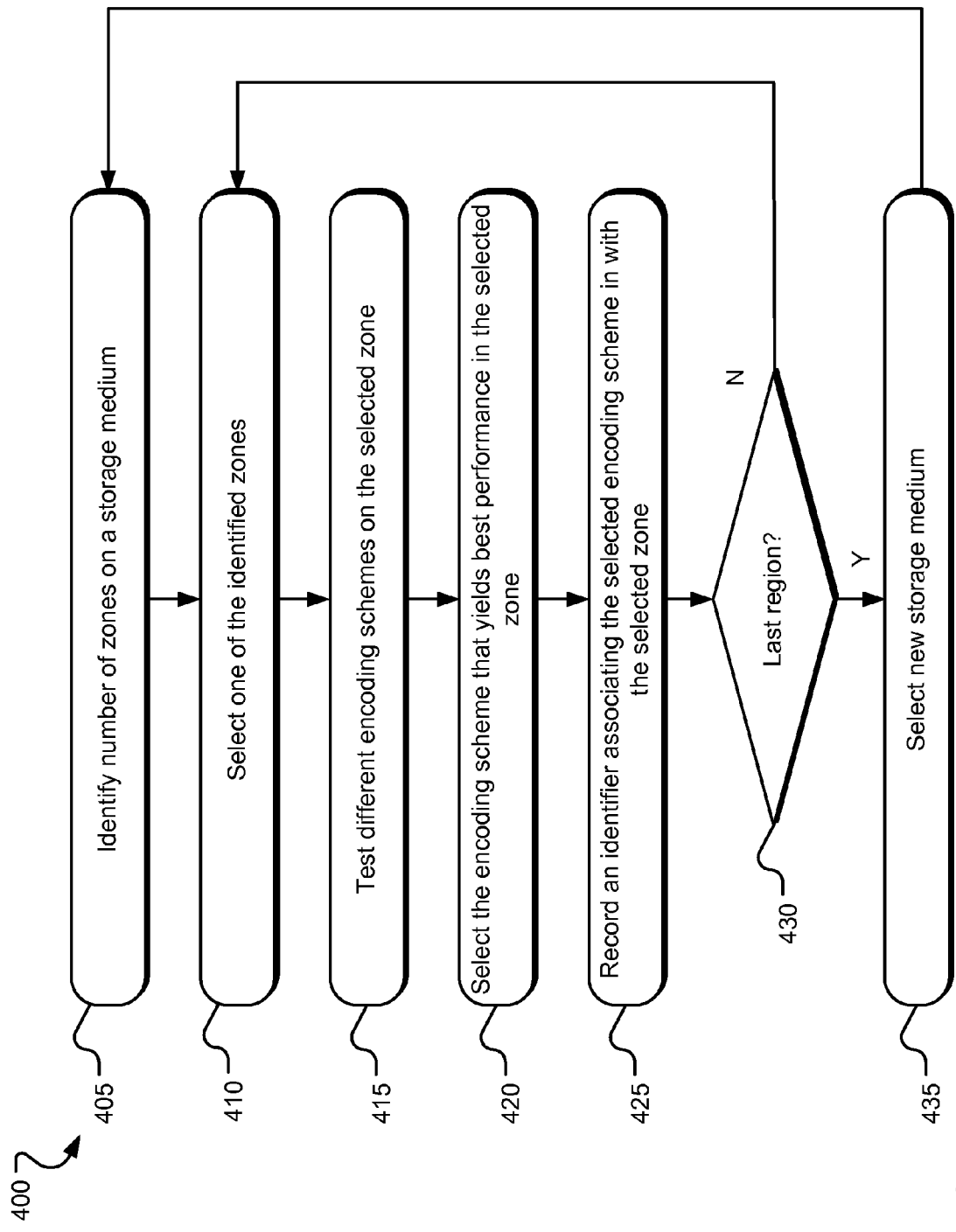
FIG. 4 illustrates example operations for implementing an encoding scheme with multiple coding redundancies.

FIG. 4 illustrates example operations 400 for implementing an encoding scheme with multiple coding redundancies. The example operations may be performed in a factory optimization process or otherwise, such as by a processor of the drive once the drive is in possession of an end user.

An identification operation 405 identifies a number of zones on a storage medium, such as a disk in a hard drive assembly. The zones may be even or uneven allocations of LBA on the storage device. The number of zones and zone boundaries may be predetermined or adaptively determined. For example, if the write head is having difficulty recording short pulses, then a wider zone with a higher ECC code rate may exist near the OD. Similarly, if the write head is having less difficulty recording short pulses, then the zone near the OD zone with the higher ECC code rate may have a smaller width.

A selection operation 410 selects one of the identified zones. Testing process 415 tests different encoding schemes on the identified zone. An encoding scheme may include multiple types of encoders. For example, one encoding scheme includes a sector-based ECC encoder, and a modulation encoder. During the testing process, performance statistics are gathered for each encoder tested alone and/or tested in combination with encoders of different encoder types. Performance statistics include, for example, bit error rate (BER) statistics and sector failure rate statistics (SFR). In one implementation, more than three encoder types are tested alone and/or in combination during the testing process 415. In another implementation, additional levels of protection (e.g., encoder types) can be dynamically added to the tested encoding scheme if the zone exhibits poor performance statistics.

Some encoder types are preselected based on the location of the identified zone on the storage medium. Other encoder types are selected via the testing process 415. Selection of one encoder type via the testing process may, in some cases, depend on one or more other preselected encoder types.

An encoding scheme selection operation 420 selects the encoding scheme that exhibits the best performance statistics in the testing process 415. A recording operation 425 creates or updates a data record indicating which encoders are associated with the selected encoding scheme. The data record may be one or more data files stored on the storage device or otherwise accessible by a processor of the storage device during a read or write operation.

A determination operation 430 determines whether other zones on the storage device have yet to be selected and tested via the operations 410-425. If other zones remain to be selected and tested, selection operation 410 selects another zone and the operations 410-425 repeat. If no other zones remain to be selected and tested, another selection operation 435 selects a new storage medium, such as another disk within a hard drive assembly. Zones on the new storage medium are identified via the identification operation 405, and operations 410-435 repeat until all recordable surfaces in the storage medium have been zoned associated with optimal encoding schemes.

The embodiments of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary implementations of the invention. Since many implementations of the invention can be created without departing from the spirit and scope of the invention, the invention resides in the claims hereinafter appended. Furthermore, structural features of the different implementations may be combined in yet another embodiment without departing from the recited claims.

What is claimed is:

1. A method comprising:
   selecting different modulation codes for use in different regions of a storage medium, a modulation code with a lower code rate being selected for use in a region of higher channel bit density and a modulation code with a higher code rate being selected for use in a region of lower channel bit density.

2. The method of claim 1, further comprising:
   selecting a single sector-based ECC code for use in each of the different regions.

3. The method of claim 1, wherein the different regions are opposing surfaces of the storage medium.

4. The method of claim 1, further comprising:
   selecting a first encoder of a first encoder type for use in a first region; and
   selecting a second different encoder of the first encoder type for use in a second region, wherein the first encoder and the second different encoder share same endec hardware.

5. The method of claim 1, further comprising:
   selecting a first ECC encoder for use in a first region; and
   selecting a second different ECC encoder for use in a second region, wherein the first ECC encoder has a lower code rate than the second different ECC encoder, and wherein the first region is closer to an inner diameter of the storage medium than the second region.

6. The method of claim 1, further comprising:
   selecting a first track-based ECC encoder for use in a first region; and
   selecting a second different track-based ECC encoder for use in a second region, wherein the first track-based ECC encoder creates fewer parity sectors than the second different track-based ECC encoder, and wherein the first region is closer to an inner diameter of the storage medium than the second region.

7. The method of claim 1, further comprising:
   selecting an encoder to encode at least one of the two or more different regions based on a manufacturing process variation of a storage device including the storage medium.

8. An apparatus comprising:
   a microcontroller configured to select a first modulation encoder for encoding data on a first surface of a storage medium based on a channel bit density of the first surface and to select a second different modulation encoder for encoding data on second different surface of the storage medium based on a channel bit density of the second different surface.

9. The microcontroller of claim 8, wherein the first surface has a higher channel bit density than the second surface and the first modulation encoder encodes data at a lower code rate than the second modulation encoder.

10. The microcontroller of claim 8, wherein the microcontroller is further configured to:
    select an ECC encoder with a first code rate for data associated with a first target location on the storage medium; and
    select another ECC encoder with a second code rate for data associated with a second target location on the storage medium, wherein the second target location is closer to an outer diameter of the storage medium than the first target location and the second code rate is higher than the first code rate.

11. The microcontroller of claim 8, wherein the microcontroller is further configured to:
    select a track-based ECC encoder to create a first number of parity sectors for data associated with a first target location on the storage medium; and
    select another track-based ECC encoder to create a second number of parity sectors for data associated with a second target location on the storage medium, wherein the second target location is closer to an outer diameter of the storage medium than the first target location and the first number of parity sectors is lower than the second number of parity sectors.

12. The microcontroller of claim 8, wherein the microcontroller is further configured to select a corresponding decoder for the selected ECC encoder.

13. The microcontroller of claim 8, wherein at least one of the first or second encoders is selected based on performance statistics of a storage medium.

14. An apparatus comprising:
    a microcontroller configured to:
    select a first track-based ECC encoder for use in a first region based on a radial location of the first region; and
    select a second different track-based ECC encoder for use in a second region based on a radial location of the second region, wherein the first track-based ECC encoder creates fewer parity sectors than the second different track-based ECC encoder, and the first region is closer to an inner diameter of the storage medium than the second region.

15. The apparatus of claim 14, wherein the microcontroller is further configured to dynamically select a modulation code for use in the first region and the second region.

* * * * *